US006972152B2

(12) United States Patent
Taggert et al.

(10) Patent No.: US 6,972,152 B2
(45) Date of Patent: Dec. 6, 2005

(54) USE OF DIRECT GOLD SURFACE FINISH ON A COPPER WIRE-BOND SUBSTRATE, METHODS OF MAKING SAME, AND METHODS OF TESTING SAME

(75) Inventors: Brian Taggert, Phoenix, AZ (US); Dale Hackitt, Mesa, AZ (US); Dilip K. Misra, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/608,059

(22) Filed: Jun. 27, 2003

(65) Prior Publication Data

US 2005/0147801 A1 Jul. 7, 2005

(51) Int. Cl.[7] ............................. B32B 9/00; H01L 23/48
(52) U.S. Cl. ...................... 428/209; 174/257; 174/261; 257/784; 257/786
(58) Field of Search ..................... 428/209; 174/250, 174/255

(56) References Cited

U.S. PATENT DOCUMENTS

| 5,097,100 | A | * | 3/1992 | Jackson ..................... 174/94 R |
| 6,063,481 | A | * | 5/2000 | Arrington et al. .......... 428/209 |
| 6,162,365 | A | * | 12/2000 | Bhatt et al. ................... 216/13 |
| 6,359,233 | B1 | * | 3/2002 | Joy et al. ..................... 174/255 |
| 6,383,401 | B1 | * | 5/2002 | Labzentis et al. ........... 430/314 |

* cited by examiner

Primary Examiner—Cathy F. Lam
(74) Attorney, Agent, or Firm—Schwegman, Lundberg, Woessner & Kluth, P.A.

(57) ABSTRACT

A wire-bonding substrate is described. The wire-bonding substrate includes a copper metallization and a gold surface finish disposed above and on the copper metallization. The gold surface finish completes a structure that includes at least one of a bond finger for wire bonding of a first side of the substrate, and a land pad for a ball attach on a second side of the substrate. A process of forming the surface finish is also disclosed. An electronic package is also disclosed that uses the surface finish on the wire-bonding substrate. A method of assembling an electronic package is also disclosed that includes the surface finish on the wire-bonding substrate. A computing system is also described that includes the surface finish on the wire-bonding substrate.

24 Claims, 5 Drawing Sheets

USE OF DIRECT GOLD SURFACE FINISH ON A COPPER WIRE-BOND SUBSTRATE, METHODS OF MAKING SAME, AND METHODS OF TESTING SAME

TECHNICAL FIELD

Disclosed embodiments relate to wire bonding for a metallization process flow. More particularly, disclosed embodiments relate to an electroless plating process flow that can be followed by in situ electrical testing (e-test), and for a wire-bonding process flow upon a copper bond finger or a copper land for a ball attach.

BACKGROUND INFORMATION

Electroplating metallization process flows are carried out to prepare bond fingers and land pads for electrical connections upon substrates. Such substrates include very-fine ball-grid array (vfBGA), stacked chip-scale package (SCSP), plastic ball-grid array (PBGA) and others. During the wire bonding process, a bond wire is used to make contact between a board layout and a metallization pad on a chip. At the edge of the array where a bus bar is exposed, this process flow often causes significant corrosion particularly if it is copper. The result is an unacceptable yield loss during assembly process, including wire-bonding process and singulation process or a field failure after the article has been placed into service.

During and after the wire bonding process, corrosion can occur in the exposed residual of the bus bar. The corrosion can be a result from at least one of several environments or other conditions. Other corrosion can occur where the wire bond meets the bond finger. Processing conditions including back-end-of-line (BEOL) testing such as a hot ambient steam test (HAST) and/or burn-in, add to corrosion. Other processing conditions add to corrosion including the galvanic differential that is established between the two disparate metals of a bond finger and a wire bond. Once corrosion begins, a variable and unpredictable contact resistance (CRES) occurs between the wire bond and the bond finger. Additionally during e-test, a copper scumming of the probe tip requires frequent and unscheduled cleaning.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting of its scope. Some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a copper-overlay structure that is insulated and that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Disclosed embodiments relate to a wire-bond process flow that eliminates copper corrosion at the edge of the package, and that minimizes corrosion in the bond finger or the land pad for a ball attach. In an embodiment, a structure embodiment is disclosed that resists corrosion of the copper pad or other metallization during processing, testing, and field use. In another embodiment, a structure embodiment is used in an electrical testing (e-test) during board pre-sorting, which includes in situ testing of a metallization layout for an individual board in a board layout array. The e-test minimizes e-test error but also lowers the e-test resistance. In an embodiment, an e-test method is disclosed that uses the structure embodiment.

A method of in situ testing means that an individual array is e-tested while the array is unsingulated from at least one other array. In an embodiment, the method of in situ testing means that an individual array is e-tested while the array is unsingulated from all other layouts in the array of wire-bonding substrates.

Figure 1:
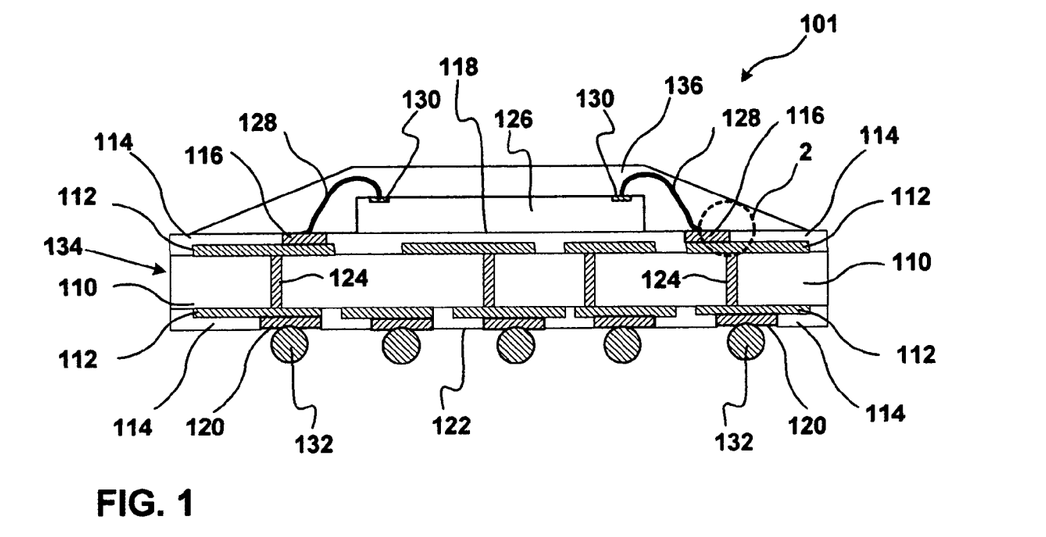
FIG. 1 is a cross-section of a package according to an embodiment.

FIG. 1 is a cross-section of a package 101 according to an embodiment. The package 101 includes a substrate 110 that has been singulated from a board layout array 500 in (see FIG. 5). A copper metallization 112 is represented in simplified manner as the board layout. The copper metallization 112 is covered by a protective layer 114. A bond finger 116 is depicted as extending through the protective layer 114 upon a first side 118 of the substrate 110. A land pad 120 for a ball attach is depicted as extending through the protective layer 114 upon a second side 122 of the substrate 110. The bond finger 116 and the land pad 120 are coupled through the substrate 110 by an interconnect 124 that is depicted in simplified form.

FIG. 1 also depicts a device 126 that is coupled to the substrate 110 with a bond wire 128, between a die bond pad 130 and the bond finger 116. Additionally, the device 126 is coupled to a bump 132 through the interconnect 124.

At the edge 134 of the package 101, the protective layer 114 acts to protect the copper metallization 112. In previous packages that needed a bus bar, copper was exposed at the package edge, which could lead to bus bar corrosion and package damage. The protective layer 114 can be the green ink, known in the art as liquid photo solder resistant (LPSR), but it can also be a polyimide material.

The device 126, the bond finger 116, and the bond wire 128 are protected by an encapsulant 136. In the embodiment depicted in FIG. 1, the encapsulant 136 is depicted as having a contoured profile. Other profiles such as a rectangular profile can be chosen depending upon the application of the bond-finger technology. After the package is mounted at the bump 132 to a larger mounting substrate (not pictured), underfill material (not pictured) is flowed between the bumps 132 to protect the bumps 132 and the land pads 120.

Figure 2:
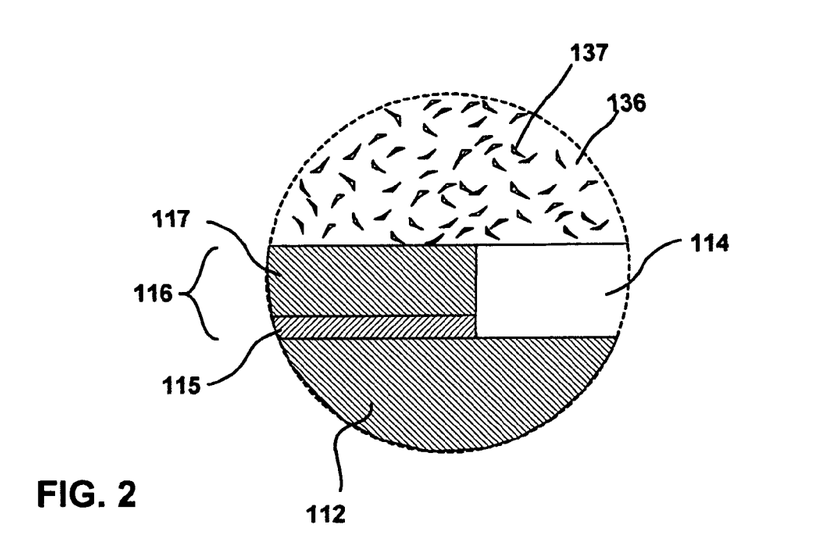
FIG. 2 is a detail section taken from FIG. 1.

FIG. 2 is a detail section taken from the depiction in FIG. 1. In FIG. 2, the detail section taken from FIG. 1 relates to a bond finger. The technology, however, is equally applicable to a land pad for a ball attach 120 (FIG. 1). In FIG. 2, a portion of the copper metallization 112 is depicted, along with the protective layer 114, the bond finger 116, and the encapsulation material 136. Optional to the encapsulation material 136, a filler material 137 is included for thermal management. A filler material 137 can include such materials as graphite, diamond, metal particles, and inorganic dielectric particles according to a contemplated use of the package 101.

In an embodiment, the bond finger 116 includes a flash plating layer 115, and a heavy plating layer 117. The flash plating layer 115, and a heavy plating layer 117 are also respectively referred to as a first plating layer 115 and a second plating layer 117, and collectively, they are referred to as a metallic surface finish 116 above and on the copper metallization 112. In a first process flow, the flash plating layer 115 is disposed above and on the copper metallization 112. The flash plating layer 115 acts as a penetration barrier that may otherwise prevent damage by a test probe tip during in situ e-test according to an embodiment. The flash plating layer 115 may also act as a seed layer for the second plating layer 117.

In an embodiment, the copper metallization 112 has a thickness range from about 0.1 micrometer ($\mu$m) to about 30 $\mu$m. In an embodiment, the copper metallization 112 has a thickness range from about 10 $\mu$m to about 20 $\mu$m. In an embodiment, the bond finger 116 has an overall thickness in a range from about 0.01 $\mu$m to about 10 $\mu$m. In an embodiment, the bond finger 116 has an overall thickness in a range from about 0.03 $\mu$m to about 1 $\mu$m. In an embodiment, the copper metallization 112 and the bond finger 116 have an overall thickness in a range from about 15.3 $\mu$m to about 31 $\mu$m.

For the bond finger 116 in an embodiment, the thickness of the flash plating layer 115 is in a range from about 10 Å to about 10,000 Å, and the thickness of the heavy plating layer 117 makes up the difference to the overall thickness of the bond finger 116 as set forth above. Accordingly, where the flash plating layer 115 is about 10 Å, the heavy plating layer 117 is from about 0.009 $\mu$m to about 30 $\mu$m. In an embodiment, the flash plating layer 115 is about one-tenth the thickness of the heavy plating layer 117. In an embodiment, the flash plating layer 115 is about one-fifth the thickness of the heavy plating layer 117. In an embodiment, the flash plating layer 115 is about one-third the thickness of the heavy plating layer 117. Accordingly, the proportional thicknesses can be applied to the various disclosed heavy plating layers 117.

In an embodiment, the copper metallization 112 is generically referred to as a metallization 112. According to this embodiment, the materials of the flash plating layer 115 the heavy plating layer 117 impart a quality upon the metallization 112 that protects the metallization from corrosion and from damage during e-test. For convenience, however, the metallization 112 is referred to hereinafter as the copper metallization 112. In an embodiment, the flash plating layer 115 is less noble or of equal electrochemical potential to the heavy plating layer 117. In an embodiment, the flash plating layer 115 is harder than the heavy plating layer 117, and the heavy plating layer 117 is more ductile than the flash plating layer 115.

In an embodiment, the flash plating layer 115 is a precious metal or precious metal alloy. The flash plating layer 115 is formed by a deposition process flow that is electroless plating. In an embodiment, the precious metal for the flash plating layer 115 includes silver (Ag), gold (Au), platinum (Pt), and combinations thereof. In an embodiment, the flash plating layer 115 is primarily gold. In an embodiment, the flash plating layer 115 is primarily silver. In an embodiment, the precious metal for the flash plating layer 115 includes nickel (Ni), palladium (Pd), platinum (Pt), and combinations thereof. In an embodiment, the flash plating layer 115 is primarily platinum. In another embodiment, precious metal for the flash plating layer 115 includes cobalt (Co), rhodium (Rh), iridium (Ir), and combinations thereof. In an embodiment, the flash plating layer 115 is primarily iridium.

One property embodiment is that the flash plating layer 115 exhibits sufficient adhesion to the copper metallization 112 that liftoff or spalling thereof will not occur during fabrication, test, and ordinary field use. Another property embodiment is that the flash plating layer 115 is hard enough that an ordinary tungsten test probe or the like, will not penetrate the flash plating layer 115 during ordinary e-test conditions.

In another embodiment, the flash plating layer 115 includes an additive/dopant that is selected from nickel, palladium, cobalt, tungsten, chromium, titanium, ti-tungsten (TiW), zirconium, hafnium, and the like. In an embodiment, the additive/dopant is supplied with the electroless plating solution in a concentration range from about 0.01 gram/liter to about 2 gram/liter. In another embodiment, the additive/dopant is supplied in a concentration range from about 0.05 gram/liter to about 1 gram/liter.

One feature of electroless plating of the flash plating layer 115 is that, due to the chemically-induced oxidation-reduction reaction that is carried out only at chemically enabled sites, no post-deposition patterning and etching needs to be done. Another feature of electroless plating of the flash plating layer 115 is that no bus bars are needed to impose cathodic behavior to the copper metallization 112. Consequently, there is no need for a bus bar structure, which would otherwise be susceptible to corrosion at the edge of the package 101. Another feature of electroless plating of the flash plating layer 115 is, because no bus bars are needed to impose cathodic behavior to the copper metallization 112, in situ testing is possible for a board that has not been singulated from a board layout array (see FIG. 5).

According to an embodiment, the substrate 110 is immersed in a bath that contains one or more metal ions, and reduction of the ions occurs at the exposed portion of the copper metallization 112 to form the flash plating layer 115.

According to an embodiment, the flash plating layer 115 is a precious metal or metal alloy that has a standard electrochemical potential that is equal to or greater than the metallization 112, in this embodiment, a copper metallization 112. In conjunction with the heavy plating layer 117 and according to an embodiment, the flash plating layer 115 is less noble than or of equal electrochemical potential to the heavy plating layer 117.

The metal ion or ions that are used to form the flash plating layer 115 may be selected from various metals or combinations as set forth above. In an embodiment, the metal is selected from at least one primary metal and from zero to at least one secondary metal. In an embodiment, the at least one primary metal is selected from Pd, Pt, Ir, Ag, Au, and combinations thereof. In another embodiment, the at least one primary metal is selected from a combination of at least two metals that combine metals from the above-referenced groups. In an embodiment, the primary metal(s) is Au, supplied in a concentration range from about 2 gram/liter to about 50 gram/liter. In another embodiment, the primary metal(s) is Au, supplied in a concentration range from about 5 gram/liter to about 35 gram/liter. Other primary metals can be supplied based upon a mole equivalent to the Au concentrations.

Reducing agents are provided to assist in assuring metal deposition of the flash plating layer 115 as well as the heavy plating layer 117. The reducing agents are used because the chemical environment of the substrate onto which the metal deposits continues to change. In an embodiment, initial deposition of a metal ion onto the copper metallization layer 112 may be autocatalytic. The changing chemical environment, however, may interrupt the autocatalytic deposition process. In an embodiment, where deposition is upon the copper metallization layer 112, initial deposition will be achieved in the presence of the copper metallization layer 112. Consequently, the copper metallization layer 112 affects the initial, presumably oxidation-reduction (REDOX) deposition chemistry. However, as the copper metallization layer 112 is covered, by way of non-limiting example, by a flash plating layer 115 of gold, the REDOX chemical environment changes from a gold-onto-copper plating, to a gold-onto-gold plating. Accordingly, a reducing agent(s) is provided to assure continued gold plating despite the changed substrate environment.

In an embodiment, the electroless plating composition is combined with from zero to at least one primary reducing agent in a mixture of solvents. In an embodiment, a primary reducing agent including boron (B) is provided. Primary reducing agents that can be utilized for this application include ammonium agents, alkali metal agents, alkaline earth metal borohydride agents, and the like, and combinations thereof. In an embodiment, inorganic primary reducing agent embodiments include sodium borohydride, lithium borohydride, zinc borohydride, and the like, and combinations thereof. In an embodiment, an organic primary reducing agent is dimethylaminoborane (DMAB). In another embodiment, other aminoboranes are used such as diethylaminoborane, morpholine borane, combinations thereof, and the like. In an embodiment, the primary reducing agent(s) is supplied in a concentration range from about 1 gram/liter to about 30 gram/liter. In another embodiment, the primary reducing agent(s) is supplied in a concentration range from about 2 gram/liter to about 20 gram/liter.

In an embodiment, a secondary reducing agent is provided to assist the changing chemical environment during deposition of the primary metal and optional secondary metal. However, the secondary reducing agent may be used alone, without the primary reducing agent. In an embodiment a phosphorus-containing compound is selected as the secondary reducing agent. Phosphorus-containing compounds may include hypophosphites. In an embodiment, the hypophosphite is selected from organic hypophosphites such as ammonium hypophosphite and the like.

In an embodiment, the hypophosphite is selected from inorganic hypophosphites such as sodium hypophosphite and the like. One embodiment includes an inorganic phosphorus-containing compound such as hypophosphites of lithium, sodium, potassium, and mixtures thereof. One embodiment includes an inorganic phosphorus-containing compound such as hypophosphites of magnesium, calcium, strontium, and mixtures thereof. One embodiment includes an inorganic phosphorus-containing compound such as nickel hypophosphite and the like. One embodiment includes an inorganic phosphorus-containing compound such as hypophosphorous acid and the like.

Other secondary reducing agents are selected from sulfites, bisulfites, hydrosulfites, metabisulfites, and the like. Other secondary reducing agents are selected from dithionates, and tetrathionates, and the like. Other secondary reducing agents are selected from thiosulfates, thioureas, and the like. Other secondary reducing agents are selected from hydrazines, hydroxylamines, aldehydes, glyoxylic acid, and reducing sugars. In another embodiment, the secondary reducing agent is selected from diisobutylaluminum hydride, sodium bis(2-methoxyethoxy)aluminum hydride, and the like.

In an embodiment, the secondary reducing agent(s) is supplied in a concentration range from about 0 gram/liter to about 5 gram/liter. In another embodiment, the secondary reducing agent(s) is supplied in a concentration range from about 1 gram/liter to about 2 gram/liter.

In an embodiment, the primary reducing agent is DMAB in a concentration range from about 1 gram/liter to about 30 gram/liter, and the secondary reducing agent is ammonium hypophosphite in a concentration range from about 0 gram/liter to about 2 gram/liter. Other embodiments include primary and secondary reducing agents that are substituted for DMAB and ammonium hypophosphite, or one of them, as long as they approximate the gram equivalent amounts of the primary and secondary reducing agents of the DMAB and the ammonium hypophosphite. The gram equivalent amounts may be adjusted by various means, such as according to the comparative dissociation constants of the reducing agents.

In addition to the reducing agents, other agents may be added such as alkaline metal-free chelating agents. Embodiments of chelating agents include citric acid, ammonium chloride, glycine, acetic acid, malonic acid, and the like in concentration range from about 5 gram/liter to about 70 gram/liter.

A complexing agent and a buffering agent are also used to hold the metal ion(s) in solution until deposition is appropriate. In an embodiment, an organic sulfate salt compound is used such as ammonium sulfate, $(NH)_2SO_4$ and the like. Other complexing and buffering agents may be selected that have an effective gram equivalent amount to the $(NH)_2SO_4$ such as copper sulfate, $CuSO_4$. In an embodiment, the complexing/buffering agent is supplied in a concentration range from about 50 gram/liter to about 1,000 gram/liter. In another embodiment, the complexing/buffering agent is supplied in a concentration range from about 80 gram/liter to about 600 gram/liter.

Various pH-adjusting compositions may be used including organic and inorganic bases. That a compound is basic can be easily confirmed by dipping pH test paper, measuring its aqueous solution using a pH meter, observing the discoloration caused by an indicator, measuring the adsorption of carbonic acid gas, and by other methods.

In an embodiment, the organic base compounds that can be used include organic amines such as pyridine, pyrrolidine, combinations thereof, and the like. Other embodiments include methylamine, dimethylamine, trimethylamine, combinations thereof, and the like. Other embodiments include ethylamine, diethylamine, triethylamine, combinations thereof, and the like. Other embodiments include tetramethylammonium hydroxide (TMAH), tetraethyl ammonium hydroxide (TEAH), tetrapropyl ammonium hydroxide (TPAH), tetrabutyl ammonium hydroxide (TBAH), combinations thereof, and the like. Other embodiments include aniline, toluidine, and the like.

In an embodiment, the organic base includes TMAH in a concentration range from about 30 mL to about 150 mL, added to a 100 mL volume of the other constituents of the electroless plating solution. Other embodiments include the gram equivalent amounts of the organic base compounds set forth herein.

In an embodiment, the inorganic base compounds that can be used are salts of strong bases and weak acids. In an embodiment, alkali metal acetates, alkaline earth metal acetates, and combinations thereof are used. In an embodiment, alkali metal propionates, alkaline earth metal propionates, and combinations thereof are used. In an embodiment, alkali metal carbonates, alkaline earth metal carbonates, and combinations thereof are used. In an embodiment, alkali metal hydroxides, alkaline earth metal hydroxides, and combinations thereof are used. In an embodiment, combinations of at least two of the acetates, propionates, carbonates, and hydroxides are used.

Inorganic base compounds may be provided in a concentration such as a 25% sodium hydroxide, NaOH in a deionized (DI) water solution, to make a volume of about 10 mL to about 50 mL. This volume of solution is added to an about 100 mL volume of the other electroless plating composition constituents. Other embodiments include the gram equivalent amounts of the inorganic base compounds set forth herein.

Other compounds may be added to the electroless plating composition such as surface active agents. One commercial surfactant is RHODAFAC RE 610, made by Aventis (formerly Rhone-Poulenc Hoechst). Another commercial surfactant is Triton x-100T™ made by Sigma-Aldrich. Other surfactants include cystine, polyethylene glycols, polypropylene glycol (PPG)/polyethylene glycol (PEG) (in a molecular range of approximately 200 to 10,000) in a concentration range of about 0.01 to 5 gram/liter, and the like.

Several combinations of primary and secondary metals are achievable according to various embodiments. The primary metal may include the gold, silver, platinum iridium, and combinations thereof with the optional additive/dopant. In an embodiment, because of the presence of at least one of the primary and secondary reducing agents, a metallic compound forms that incorporates at least one of boron and phosphorus.

In an embodiment, gold is a primary metal for an electroless plating embodiment to form the flash plating layer 115, the composition includes a gold solution to form a gold flash plating layer 115. According to an embodiment, where gold is the primary metal, because of the electroless plating bath environment, a metallic film forms that includes but is not limited by such combinations as Au, AuB, AuP, AuBP, AuAg, AuAgB, AuAgP, AuAgBP, AuPd, AuPdB, AuPdP, AuPdBP, AuPt, AuPtB, AuPtP, AuPtBP, AuIr, AuIrB, AuIrP, and AuIrBP. In these gold compounds, as in other embodiments set forth in this disclosure, where a given element is listed first, second, third, etc., one embodiment includes the largest presence in the first-listed element, the second largest presence in the second listed element, etc. Thus, where AuAgB is set forth, the concentrations are 70Au28Ag2B, by way of non-limiting example. In another example, where AuAgB is set forth, the concentrations are 95Au4.5Ag0.5B. In any event, the gold is at least the largest presence, the additive/dopant is the medium presence, and the boron and/or phosphorus, if present, is the smallest presence.

In another embodiment, the flash plating layer 115 uses silver as a primary metal for an electroless plating embodiment. The plating composition includes a silver solution to form a silver plating layer. According to an embodiment, where silver is the primary metal, because of the electroless plating bath environment, metallic films form that include but are not limited by such combinations as Ag, AgB, AgP, AgBP, AgAu, AgAuB, AgAuP, AgAuBP, AgPd, AgPdB, AgPdP, AgPdBP, AgPt, AgPtB, AgPtP, AgPtBP, AgIr, AgIrB, AgIrP, and AgIrBP. In these silver compounds, as in other embodiments set forth in this disclosure, where a given element is listed first, second, third, etc., one embodiment includes the largest presence in the first-listed element, the second largest presence in the second listed element, etc. Thus, where AgAuB is set forth, the concentrations may be 70Ag28Au2B, by way of non-limiting example. In another example, where AgAuB is set forth, the concentrations are 95Ag4.5Au0.5B. In any event, the silver is at least the largest presence, the additive/dopant is the medium presence, and the boron and/or phosphorus, if present, is the smallest presence.

In another embodiment, the flash plating layer 115 uses platinum as a primary metal for an electroless plating embodiment. The plating composition includes a platinum solution to form a platinum plating layer. According to an embodiment, where platinum is the primary metal, because of the electroless plating bath environment, metallic films form that include but are not limited by such combinations as Pt, PtB, PtP, PtBP, PtAu, PtAuB, PtAuP, PtAuBP, PtPd, PtPdB, PtPdP, PtPdBP, PtAgB, PtAgP, PtAgBP, PtIr, PtIrB, PtIrP, and PtIrBP. In these platinum compounds, as in other embodiments set forth in this disclosure, where a given element is listed first, second, third, etc., one embodiment includes the largest presence in the first-listed element, the second largest presence in the second listed element, etc. Thus, where PtAuB is set forth, the concentrations may be 70Pt28Au2B, by way of non-limiting example. In another example, where PtAuB is set forth, the concentrations are 95Pt4.5Au0.5B. In any event, the platinum is at least the largest presence, the additive/dopant is the medium presence, and the boron and/or phosphorus, if present, is the smallest presence.

The heavy plating layer 117 is formed that in an embodiment is at least one of a more noble, or a softer (more ductile) metal than the flash plating layer 115. In an embodiment, the heavy plating layer 117 is selected from gold, doré, platinum, and other compositions that are more noble and more ductile than the flash plating layer 115.

One embodiment includes a heavy plating layer 117 that resists alloying with a bond wire during ordinary wire-bonding process flows. In an embodiment, an aluminum or aluminum alloy bond wire 128 is attached to the heavy plating layer 117. In an embodiment, a gold or gold alloy bond wire 128 is attached to the heavy plating layer 117. In an embodiment, a silver or silver alloy bond wire 128 is attached to the heavy plating layer 117. In an embodiment, a doré bond wire 128 is attached to the heavy plating layer 117. In an embodiment, a platinum or platinum alloy bond wire 128 is attached to the heavy plating layer 117.

In such embodiments, the heavy plating layer 117 is of a composition that is substantially immiscible with the material of the bond wire 128 under ordinary wire-bonding conditions.

The formation of the heavy plating layer 117 is carried out according to vapor deposition techniques, or by liquid plating techniques as set forth herein. In an embodiment, formation of the heavy plating layer 117 is carried out by electroless plating by using a gold-cyanide electroless plating solution, and the Merrill-Crowe technique. In this embodiment, an atom-thick layer of zinc (Zn, not pictured) is pre-plated onto the flash plating layer 115 by an electroless process that does not substantially cover the protective layer 114, and the gold-cyanide solution is contacted with the zinc which causes the reduction of the gold out of the gold-cyanide complex.

In another electroless plating embodiment, the substrate 110 is contacted with a gold halide solution, and the Eh-pH environment of the solution is manipulated according to a technique by Pourbaix. In an embodiment, the flash plating layer 115 acts as an autocatalytic surface to assist the selective precipitation of the heavy plating layer 117.

In another embodiment, the heavy plating layer 117 is formed by a chemical vapor deposition (CVD) process that is carried out during which an organometallic gold vapor or a gold halide vapor is metered toward the semiconductor structure 110, blanket deposited, and patterned with an etch. In another embodiment, the heavy plating layer 117 is formed by a physical vapor deposition (PVD) process that is carried out in which a gold target is impinged under PVD conditions to form a blanket layer of gold that is subsequently patterned into the heavy plating layer 117.

Figure 3:
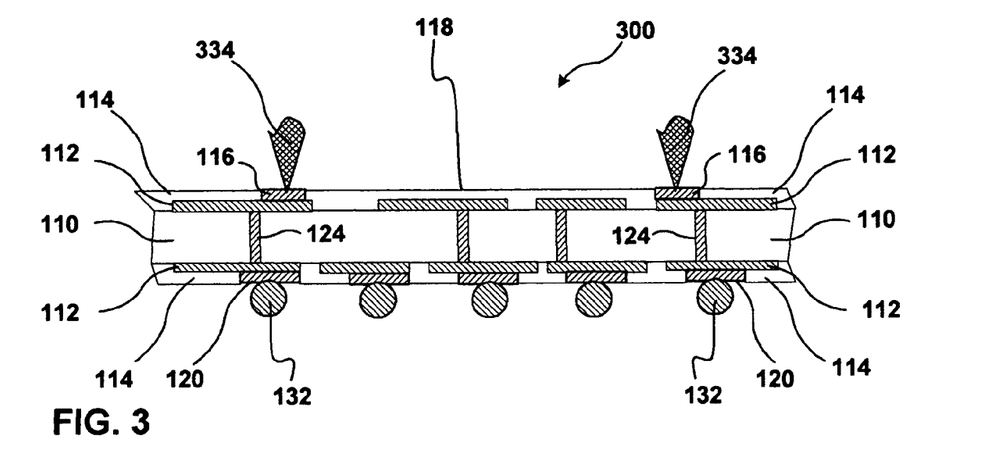
FIG. 3 illustrates a single board layout that is part of a board layout array according to an embodiment.

FIG. 3 illustrates a single board layout 300 that is part of a board layout array according to an embodiment. The detail of one board layout is depicted during an e-test, before pick-and place locating of the device 126 (FIG. 1) upon the substrate 110 and wire bonding are carried out. A tungsten test probe tip 334 or the like is depicted as penetrating into the heavy plating layer (FIG. 4), and being electrically coupled to the flash plating layer 115 without penetrating it. The test probe tip 234 under prior methods, experienced an ohmic resistance in a range from about 5 ohms ($\Omega$) or greater. According to an embodiment, the ohmic resistance during an e-test is in a range from about 0.5 $\Omega$ to about 4 $\Omega$. In another embodiment, the ohmic resistance during an e-test is in a range from about 0.75 $\Omega$ to about 2 $\Omega$. In another embodiment, the ohmic resistance during an e-test is in a range from about 0.95 $\Omega$ to about 1.5 $\Omega$. In another embodiment, the ohmic resistance during an e-test is about 1 $\Omega$.

Under previous process flows, and according to previous board architectures, corrosion of the metallization 112 at the edge of the singulated board could be significant enough to cause the rejection during the probe for sort e-test. According to an embodiment, because the protective layer 114 protects the copper metallization 112, the copper metallization 112 is protected from corrosion. According to an embodiment, the flash plating layer 115 (FIG. 4) protects the copper metallization 112 from physical stresses, and the heavy plating layer 117 protects the copper metallization 112 from corrosive stresses.

Figure 4:
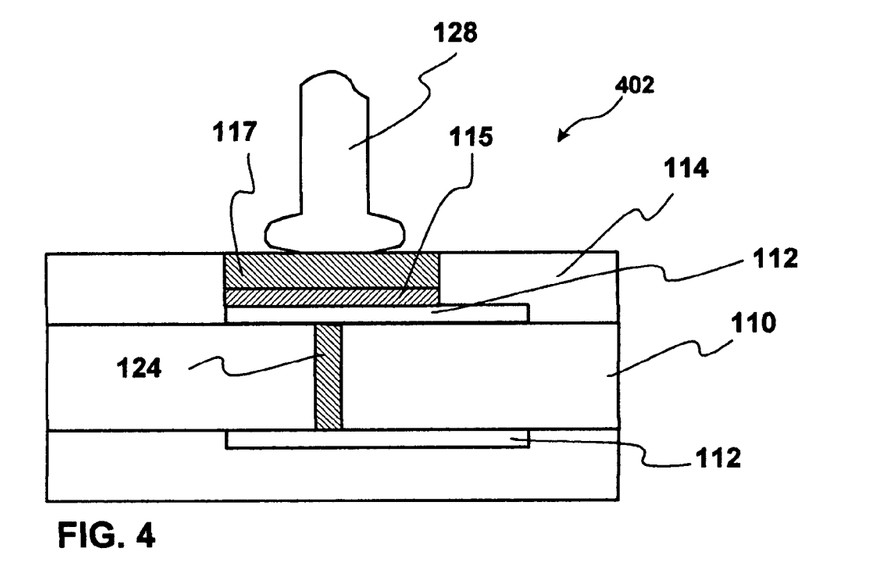
FIG. 4. is a detail section of a wire bond according to an embodiment.

FIG. 4. is a detail section of a wire bond according to an embodiment. FIG. 4 illustrates an embodiment of the package 402 after e-test, or after further processing. A bond wire 128 is depicted as having been bonded to the heavy plating layer 117. As set forth herein, the metal of the bond wire 128 is selected from aluminum or an aluminum alloy, gold or a gold alloy, silver or a silver alloy, doré, or platinum or a platinum alloy. In an embodiment, the heavy plating layer 117 is a material that resists alloying with bond wire 128.

One feature of an embodiment is the ability of the heavy plating layer 117 to bond with bond wire 128, but not to alloy therewith. In some applications, a bond wire article may be rejected by pulling or cutting the bond wires and repeating the bond wire process flow. According to an embodiment, because the copper metallization 112 is significantly protected from both physical and corrosive stresses, the bond wire 128 is cut or pulled away from the heavy plating layer 117, and wire bonding is repeated with no significant change in the ohmic resistance through the heavy plating layer 117 and the flash plating layer 115. Accordingly, ohmic resistance in a second wire bonding process when compared to a first wire bonding process changes, by a range from about 50% reduction to about 150% improvement, and in another embodiment, from about 10% reduction to about 110% improvement.

Figure 5:
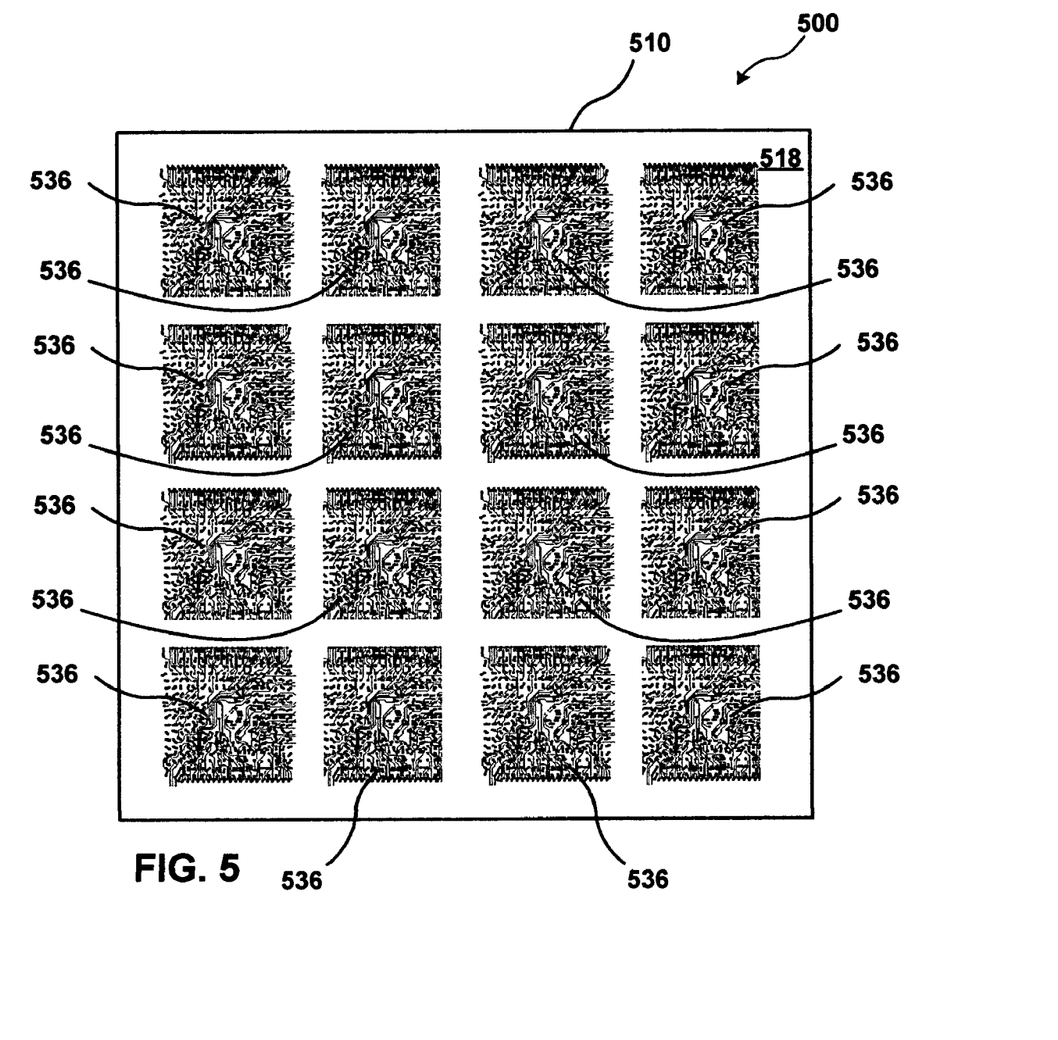
FIG. 5 is a plan view of a board layout array according to an embodiment.

FIG. 5 is a plan view of a board layout array 500 according to an embodiment. A first side 518 of a substrate 510 is analogous to the first side 118 of the substrate 110 depicted in FIG. 1. Within the board layout array 500 are depicted 16 unsingulated arrays 536. No bus bars are present. Processing to achieve a flash plating layer and a heavy plating layer is accomplished by electroless plating and other techniques set forth in this disclosure.

FIG. 5 also represents the board layout array 500 after an in situ e-test has been conducted on at least one of the unsingulated arrays 536. For an in situ e-test, reference is made to the structure depicted in FIG. 3. Because electroless plating has accomplished the flash plating—and the heavy plating layers of the bond finger, no shorting between unsingulated arrays is present to hinder the in situ e-test. Accordingly, rapid e-testing and notation of rejected and passed, layouts can be done before singulation of the board layout array 500 into individual board layouts.

Figure 6:
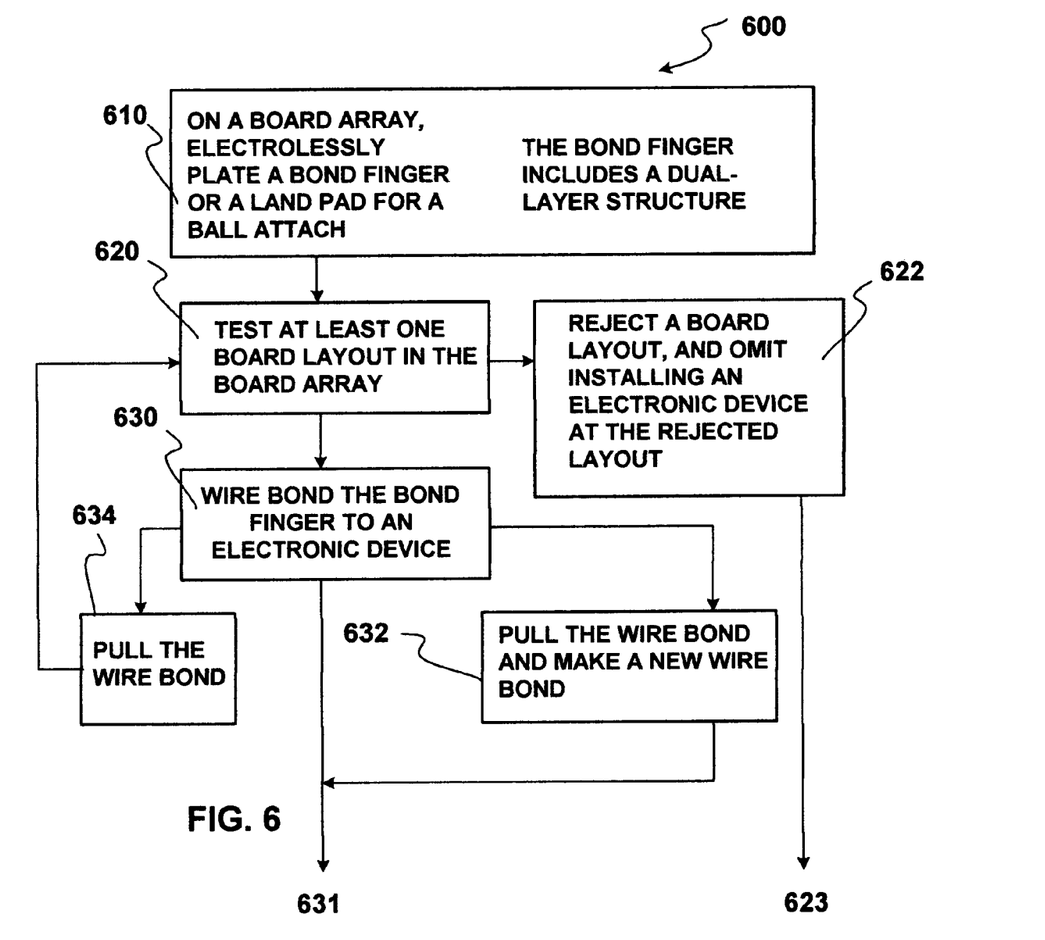
FIG. 6 is a process flow diagram according to various embodiments.

FIG. 6 is a process flow diagram according to an embodiment. The process flow indicates bond finger formation. The process 600, however, is understood to include forming a plating layer on a land pad for a ball attach, such as the land pad 120 depicted in FIG. 1.

At 610, the process commences by electrolessly plating a bond finger on a metallization. The bond finger includes a dual-layer structure such as a flash plating layer and a heavy plating layer. In an embodiment, the process flow is completed at 610.

At 620, the process includes in situ testing of at least one board layout in a board layout array. The in situ testing allows for rapid testing of board layouts, and it avoids handling problems later in processing such as pick-and-place processing of an electronic device. In an embodiment, the process flow is completed at 620.

At 622, the process continues by rejecting a board layout that has failed the in situ testing. In an embodiment, the process flow is completed at 623.

At 630 the process continues by wire bonding the bond finger to an electronic device. In an embodiment, the process flow is completed at 631.

At 632, the process flow takes an alternative path by pulling the wire bond and making a new wire bond. In one particular exemplary embodiment, the heavy plating layer 117 (FIG. 4) is a protective structure that allows for both in situ testing and, if necessary, pulling a wire bond and repeating the wire-bonding process.

At 634, a wire bond is pulled and the board layout array is re-tested. Processing can then be continued.

Figure 7:
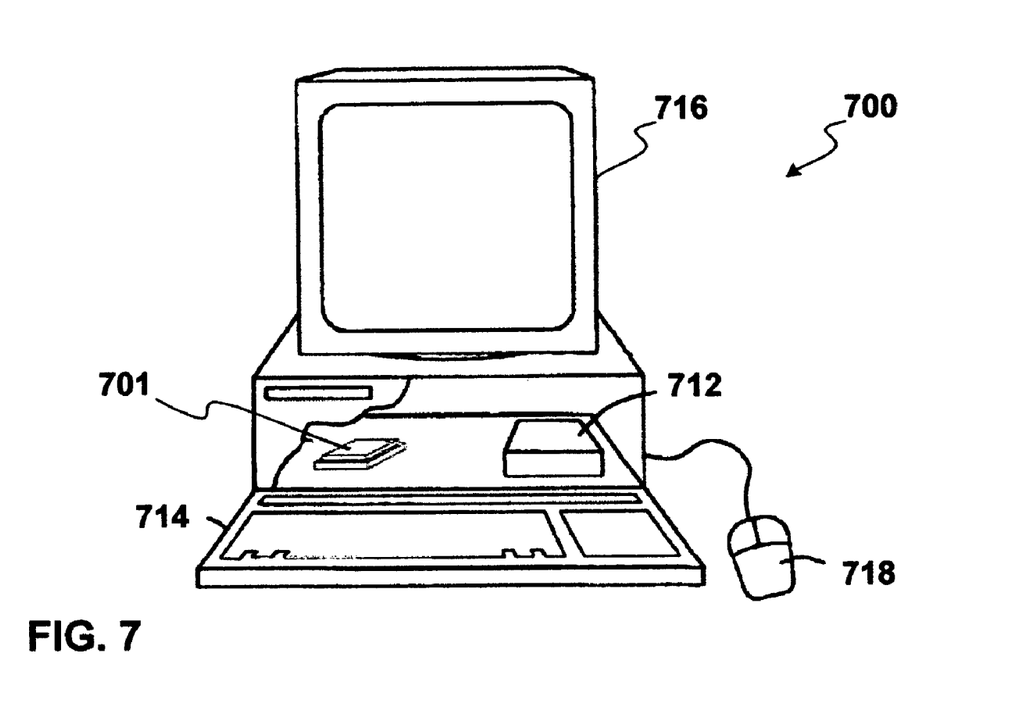
FIG. 7 is a depiction of a computing system according to an embodiment.

FIG. 7 is a depiction of a computing system 700 according to an embodiment. One or more of the foregoing embodiments of a bond finger or a land pad for a ball attach may be utilized in a computing system, such as a computing system 700 of FIG. 7. The computing system 700 includes at least one processor (not pictured), which is enclosed in a package 701, a data storage system 712, at least one input device such as keyboard 714, and at least one output device such as monitor 716, for example. The computing system 700 includes a processor that processes data signals, and it may include, for example, a microprocessor, available from Intel Corporation. In addition to the keyboard 714, the computing system 700 can include another user input device such as a mouse 718, for example.

For purposes of this disclosure, a computing system 700 embodying components in accordance with the claimed subject matter may include any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

It can now be appreciated that embodiments set forth in this disclosure can be applied to devices and apparatuses other than a traditional computer. For example, a die can be packaged with an embodiment of the bond finger and/or land pad for a ball attach, and placed in a portable device such as a wireless communicator or a hand-held such as a personal data assistant and the like. Another example is a die that can be packaged with an embodiment of the bond finger and/or land pad for a ball attach and placed in a vehicle such as an automobile, a locomotive, a watercraft, an aircraft, or a spacecraft.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this subject matter may be made without departing from the principles and scope of the subject matter as expressed in the subjoined claims.

What is claimed is:

1. An article comprising:
a wire-bonding substrate including a first surface and a second surface, wherein the substrate includes at least one of:
  a bond finger disposed on the first surface, wherein the bond finger includes a metallization in the substrate, and includes a metallic surface finish above and on the metallization;
  a land pad for a ball attach on the second surface, wherein the land pad exposes a metallization in the substrate, and includes a metallic surface finish below and on the metallization; and
  wherein the metallic surface finish has a higher electrochemical potential than the metallization in the substrate, wherein the metallization is copper, and wherein the metallic surface finish includes:
    a first plating layer above and on the metallization, wherein the first plating layer is selected from gold, gold alloy, silver, silver alloy, platinum, platinum alloy, iridium, iridium alloy, and combinations thereof; and
    a second plating layer above and on the first plating layer, wherein the second plating layer includes an equal or higher electrochemical potential than the first plating layer, and wherein the metallic surface finish is in a thickness range from about 0.01 $\mu$m to about 10 $\mu$m.

2. An article comprising:
a wire-bonding substrate including a first surface and a second surface, wherein the substrate includes at least one of:
  a bond finger disposed on the first surface, wherein the bond finger includes a metallization in the substrate, and includes a metallic surface finish above and on the metallization;
  a land pad for a ball attach on the second surface, wherein the land pad exposes a metallization in the substrate, and includes a metallic surface finish below and on the metallization; and
  wherein the metallic surface finish has a higher electrochemical potential than the metallization in the substrate, wherein the metallization is copper, and wherein the metallic surface finish includes:
    a gold first plating layer above and on the metallization; and
    a gold second plating layer above and on the first plating layer, and wherein the metallic surface finish is in a thickness range from about 0.01 $\mu$m to about 10 $\mu$m.

3. An article comprising:
a wire-bonding substrate including a first surface and a second surface, wherein the substrate includes at least one of:
  a bond finger disposed on the first surface, wherein the bond finger includes a metallization in the substrate, and includes a metallic surface finish above and on the metallization;
  a land pad for a ball attach on the second surface, wherein the land pad exposes a metallization in the substrate, and includes a metallic surface finish below and on the metallization; and
  wherein the metallic surface finish has a higher electrochemical potential than the metallization in the substrate, wherein the metallization is copper, and wherein the metallic surface finish includes:

a first plating layer above and on the metallization, wherein the first plating layer is selected from gold, gold alloy, silver, silver alloy, platinum, platinum alloy, iridium, iridium alloy, and combinations thereof; and a second plating layer above and on the first plating layer, and wherein the second plating layer includes an equal or higher electrochemical potential than the first plating layer.

4. An article comprising:
a wire-bonding substrate including a first surface and a second surface, wherein the substrate includes at least one of:
a bond finger disposed on the first surface, wherein the bond finger includes a metallization in the substrate, and includes a metallic surface finish above and on the metallization;
a land pad for a ball attach on the second surface, wherein the land pad includes a metallization in the substrate, and includes a metallic surface finish below and on the metallization; and
wherein the metallic surface finish has a higher electrochemical potential than the metallization in the substrate.

5. The article according to claim 4, wherein the metallization is a copper metallization, and wherein the metallic surface finish is selected from gold, gold alloy, silver, silver alloy, platinum, platinum alloy, iridium, iridium alloy, and combinations thereof.

6. The article according to claim 4, wherein the metallic surface finish includes a first plating layer above and on the metallization, and a second plating layer above and on the first plating layer.

7. The article according to claim 4, wherein the metallization is copper, and wherein the metallic surface finish includes a gold first plating layer above and on the metallization, and a gold second plating layer above and on the gold first plating layer.

8. The article according to claim 4, wherein the metallization is copper, and wherein the metallic surface finish includes a first plating layer above and on the metallization and a second plating layer above and on the first plating layer, and wherein the metallic surface finish is in a thickness range from about 0.01 $\mu$m to about 10 $\mu$m.

9. An article comprising:
a wire-bonding substrate including a first surface and a second surface, wherein the substrate includes at least one of:
a bond finger disposed on the first surface, wherein the bond finger includes a metallization in the substrate, and includes a metallic surface finish above and on the metallization; and
wherein the metallic surface finish has a higher electrochemical potential than the metallization in the substrate and wherein the metallic surface finish is selected from gold, gold alloy, silver, silver alloy, platinum, platinum alloy, iridium, iridium alloy, and combinations thereof.

10. The article of claim 9, wherein the metallization is a copper metallization, and wherein the metallic surface finish on the bond finger is selected from gold, gold alloy, silver, silver alloy, platinum, platinum alloy, iridium, iridium alloy, and combinations thereof.

11. The article of claim 9, wherein the metallic surface finish includes a first plating layer above and on the metallization, and a second plating layer above and on the first plating layer.

12. The article of claim 11, wherein the metallization is a copper metallization, and wherein the metallic surface finish is selected from gold, gold alloy, silver, silver alloy, platinum, platinum alloy, iridium, iridium alloy, and combinations thereof.

13. The article of claim 9, wherein the metallic surface finish includes a first plating layer above and on the metallization, and a second plating layer above and on the first plating layer, and wherein the metallic surface finish finger is in a thickness range from about 0.01 $\mu$m to about 10 $\mu$m.

14. The article of claim 13, wherein the metallization is a copper metallization, and wherein the metallic surface finish is selected from gold, gold alloy, silver, silver alloy, platinum, platinum alloy, iridium, iridium alloy, and combinations thereof.

15. The article of claim 9, wherein the metallic surface finish includes a first plating layer above and on the metallization in a thickness range from about 10 Å to about 10,000 Å, and a second plating layer above and on the first plating layer, and wherein the metallic surface finish is in a thickness range from about 0.01 $\mu$m to about 10 $\mu$m.

16. The article of claim 15, wherein the metallization is a copper metallization, and wherein the metallic surface finish is selected from gold, gold alloy, silver, silver alloy, platinum, platinum alloy, iridium, iridium alloy, and combinations thereof.

17. The article of claim 9, further including a land pad for a ball attach on the second surface, wherein the land pad includes a metallization in the substrate, and a metallic surface finish below and on the metallization.

18. The article of claim 17, wherein the metallization is a copper metallization, and wherein the metallic surface finish on the land pad is selected from gold, gold alloy, silver, silver alloy, platinum, platinum alloy, iridium, iridium alloy, and combinations thereof.

19. The article of claim 17, wherein the metallic surface finish on the land pad includes a first plating layer below and on the metallization land pad, and a second plating layer below and on the first plating layer.

20. The article of claim 19, wherein the metallization is a copper metallization, and wherein the metallic surface finish on the land pad is selected from gold, gold alloy, silver alloy, platinum, platinum alloy, iridium, iridium alloy, and combinations thereof.

21. The article of claim 17, wherein the metallic surface finish on the land pad includes a first plating layer below and on the metallization, and a second plating layer below and on the first plating layer, and wherein the metallic surface finish on the metallization bond finger is in a thickness range from about 0.01 $\mu$m to about 10 $\mu$m.

22. The article of claim 21, wherein the metallization is a copper metallization, and wherein the metallic surface finish on the land pad is selected from gold, gold alloy, silver, silver alloy, platinum, platinum alloy, iridium, iridium alloy, and combinations thereof.

23. The article of claim 17, wherein the metallic surface finish on the land pad includes a first plating layer below and on the metallization in a thickness range from about 10 Å to about 10,000 Å, and a second plating layer below and on the first plating layer, and wherein the metallic surface finish on the bond finger is in a thickness range from about 0.01 $\mu$m to about 10 $\mu$m.

24. The article of claim 23, wherein the metallization is a copper metallization, and wherein the metallic surface finish on the land pad is selected from gold, gold alloy, silver, silver alloy, platinum, platinum alloy, iridium, iridium alloy, and combinations thereof.

* * * * *